United States Patent
Chang et al.

(10) Patent No.: US 8,259,492 B2
(45) Date of Patent: *Sep. 4, 2012

(54) METHOD OF READING DUAL-BIT MEMORY CELL

(75) Inventors: Yao-Wen Chang, Hsinchu (TW); Tao-Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/914,020

(22) Filed: Oct. 28, 2010

(65) Prior Publication Data

US 2011/0038208 A1 Feb. 17, 2011

Related U.S. Application Data

(63) Continuation of application No. 11/905,211, filed on Sep. 28, 2007, now Pat. No. 7,830,707.

(30) Foreign Application Priority Data

Sep. 29, 2006 (TW) .............................. 95136392 A

(51) Int. Cl.
*G11C 11/34* (2006.01)

(52) U.S. Cl. ............... 365/185.03; 365/207; 365/189.07

(58) Field of Classification Search ............ 365/185.03, 365/163, 148, 207, 211, 185.08, 218, 189.07, 365/189.15, 185.23, 185.18, 185.15
See application file for complete search history.

(56) References Cited

U.S. PATENT DOCUMENTS

| | | | |
|---|---|---|---|
| 6,525,969 B1 | 2/2003 | Kurihara et al. | |
| 7,283,402 B2 | 10/2007 | Randolph et al. | |
| 7,297,634 B2 * | 11/2007 | Wang | 438/700 |
| 7,357,247 B2 * | 4/2008 | Guenther | 206/139 |
| 7,830,707 B2 * | 11/2010 | Chang et al. | 365/185.03 |
| 7,860,187 B2 * | 12/2010 | Akahori | 375/303 |
| 2004/0017693 A1 | 1/2004 | Kuo et al. | |
| 2006/0274576 A1 | 12/2006 | Redaelli et al. | |
| 2007/0064490 A1 * | 3/2007 | Kato et al. | 365/185.21 |
| 2007/0076499 A1 * | 4/2007 | Iwata et al. | 365/208 |
| 2007/0146182 A1 * | 6/2007 | Chen et al. | 341/120 |
| 2007/0152736 A1 * | 7/2007 | Itoh et al. | 327/534 |

FOREIGN PATENT DOCUMENTS

| TW | 463330 | 11/2001 |
|---|---|---|
| TW | 474022 | 1/2002 |
| TW | 588454 | 5/2004 |
| TW | 200503188 A | 1/2005 |

\* cited by examiner

*Primary Examiner* — Dang Nguyen
(74) *Attorney, Agent, or Firm* — Bacon & Thomas, PLLC

(57) ABSTRACT

A method of reading a dual-bit memory cell includes a controlling terminal, a first terminal, and a second terminal. The dual-bit memory cell has a first bit storage node and a second bit storage node near the first terminal and the second terminal respectively. First, a controlling voltage and a read voltage are applied to the controlling terminal and the first terminal respectively. The second terminal is grounded to measure a first output current value of the first terminal. Then, the controlling voltage and the read voltage are applied to the controlling terminal and the second terminal respectively. The first terminal is grounded to measure a second output current value of the second terminal. Afterward, the bit state of the first bit storage node and the bit state of the second bit storage node is read simultaneously according to the first output current value and the second output current value.

22 Claims, 8 Drawing Sheets

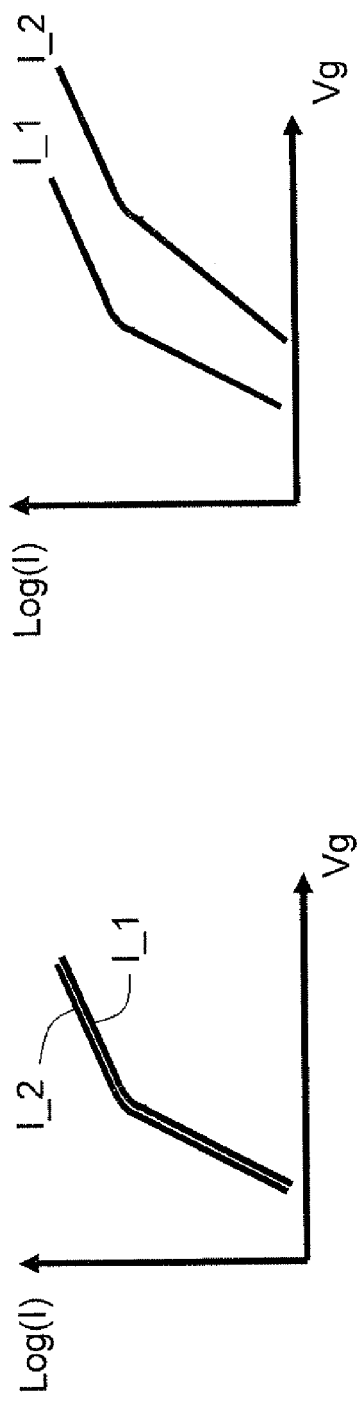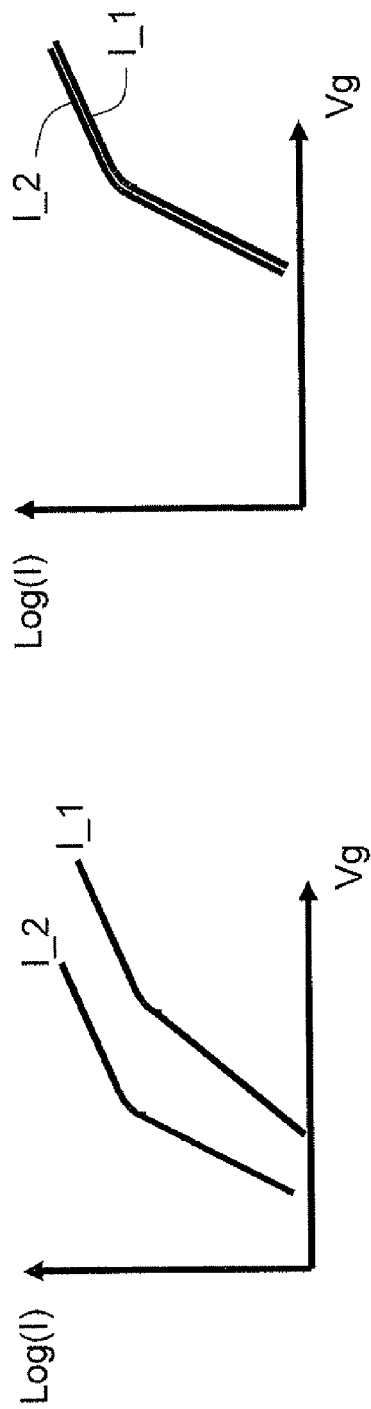

METHOD OF READING DUAL-BIT MEMORY CELL

This application is a continuation application of U.S. patent application Ser. No. 11/905,211, filed on Sep. 28, 2007 which claims the benefit of Taiwan application Serial No. 95136392, filed Sep. 29, 2006, the subject matter of which are incorporated herein by reference.

BACKGROUND OF THE INVENTION

1. Field of the Invention

The invention relates in general to a method of reading a dual-bit memory cell, and more particularly to a method of reading a dual-bit nitride trapping layer memory cell.

2. Description of the Related Art

Please refer to FIG. 1. FIG. 1 is a cross-sectional view of a nitride trapping layer memory cell. In order to achieve a memory device with high density, a dual-bit nitride trapping layer memory cell 10 is developed to replace a conventional single-bit memory cell using a floating gate. As shown in FIG. 1, the nitride real-only memory cell 10 includes a bulk 15 implanted with a source 12 and a drain 14. An oxide-nitride-oxide (ONO) structure 16 and a gate 13 are formed over the bulk 15. The ONO structure 16 includes a top oxide layer 16a, a nitride layer 16b and a bottom oxide layer 16c stacked together.

The nitride layer 16b (such as silicon nitride) of the ONO structure 16 functions as a non-conductive charge-trapping layer. Accordingly, when a programming operation is performed, electrons are injected and captured on two sides (adjacent to the source 12 and the drain 14 respectively) of the nitride layer 16b. As a result, a first bit storage node B1 and a second bit storage node B2 are formed on the two sides of the nitride layer 16b respectively, as shown in the area circled by the dotted line in FIG. 1. A single-bit logic 1 or 0 is stored respectively according to whether electrons are captured. Through the first bit storage node B1 and the second bit storage node B2, the nitride trapping layer memory cell 10 can store two bits at a time. Preferably, the bit states of the first bit storage node and the second bit storage node are independently accessed by comparing an output current value and a predetermined reference value of the nitride trapping layer memory cell 10 through reverse read. However, a second-bit effect affects the output current value of the nitride trapping layer memory cell 10 and limits the setting range of the predetermined reference value significantly. As a result, the sensing window is decreased.

SUMMARY OF THE INVENTION

The invention is directed to a method of reading a dual-bit memory cell. The present invention simultaneously determines the bit states of the two bit storage nodes according to two output current values in two different reading directions respectively. As a result, the bit state is determined more correctly, and the sensing window is increased effectively.

According to the present invention, a method of reading a dual-bit memory cell is provided. The dual-bit memory cell includes a controlling terminal, a first terminal and a second terminal. The dual-bit memory cell includes a first bit storage node and a second bit storage node adjacent to the first terminal and the second terminal respectively. The method includes the following steps. First, a controlling voltage and a read voltage are applied to the controlling terminal and the first terminal respectively. Also, the second terminal is grounded so as to measure a first output current value of the first terminal. Next, the controlling voltage and the read voltage are applied to the controlling terminal and the second terminal respectively. Also, the first terminal is grounded so as to measure the second output current value of the second terminal. Afterward, the bit states of the first bit storage node and the second bit storage node are determined simultaneously according to the first output current value and the second output current value.

The invention will become apparent from the following detailed description of the preferred but non-limiting embodiments. The following description is made with reference to the accompanying drawings.

BRIEF DESCRIPTION OF THE DRAWINGS

FIGS. 4A~4D illustrate a first output current value I_1 and a second output current value I_2 changing according to a controlling voltage Vg in the four kinds of bit state of the dual-bit memory cell;

DETAILED DESCRIPTION OF THE INVENTION

Figure 1:
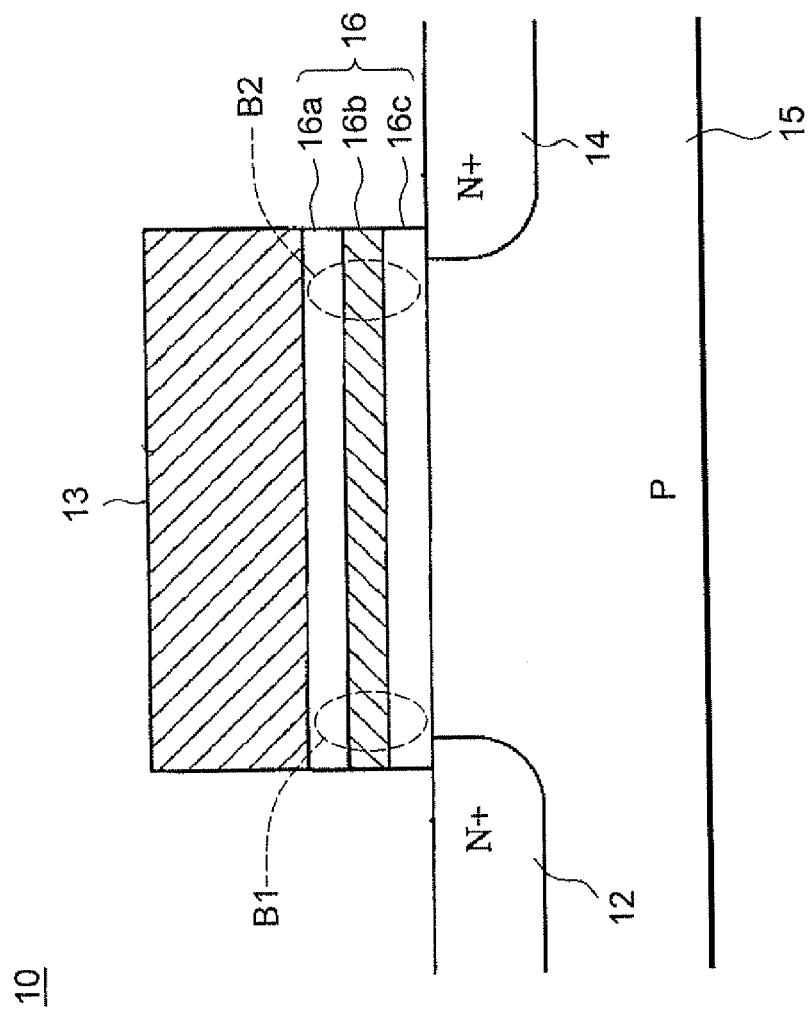
FIG. 1 is a cross-sectional view of a nitride trapping layer memory cell.

Please referring to FIGS. 2A~2D, four kinds of bit states of a dual-bit memory cell are illustrated in FIGS. 2A~2D. The dual-bit memory cell 200 is a nitride trapping layer memory cell for example and includes a controlling terminal G, a first terminal D, a second terminal S and an oxide-nitride-oxide (ONO) structure 210. The controlling terminal G, the first terminal D and the second terminal S are a gate, a drain and a source respectively as an example. Furthermore, a first bit storage node B1 and a second bit storage node B2 (as shown in the area circled by dotted lines) are formed near the first terminal D and the second terminal S of the dual-bit memory cell 200 respectively.

Even more, the dual-bit memory cell 200 may be a BE-SONOS memory cell. Please referring to FIGS. 2E~2H, four kinds of bit states of the BE-SONOS memory cell are illustrated in FIGS. 2E~2H. The BE-SONOS memory cell 220 includes a controlling terminal G, a first terminal D, a second terminal S and an oxide-nitride-oxide-nitride-oxide (ONONO) structure 230. The ONONO structure 230 is substantially obtained by replacing the tunneling oxide layer of the ONO structure 210 with an oxide-nitride-oxide layer. The principles of the BE-SONOS memory cell 230 in FIGS. 2E~2H are similar to that of the dual-bit memory cell 200 in FIGS. 2A~2D, and are not repeated hereinabove. The thickness of bottom oxide layer 231 is thinner than 2 nm, or between 0.5 nm to 2 nm, or smaller than 1.5 nm. The thickness of nitride layer 232 is thinner than 2 nm, or between 1 nm to 2 nm. The thickness of upper oxide layer 233 is thinner than 2 nm, or between 1.5 nm to 2 nm.

Figure 2C:
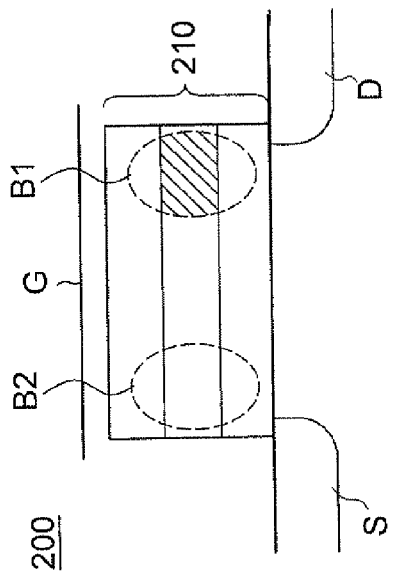
FIGS. 2A~2D illustrate four kinds of bit state of a dual-bit memory cell.
Figure 2D:
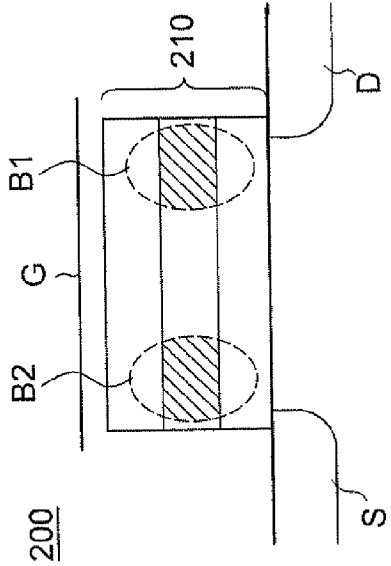
Figure 2A:
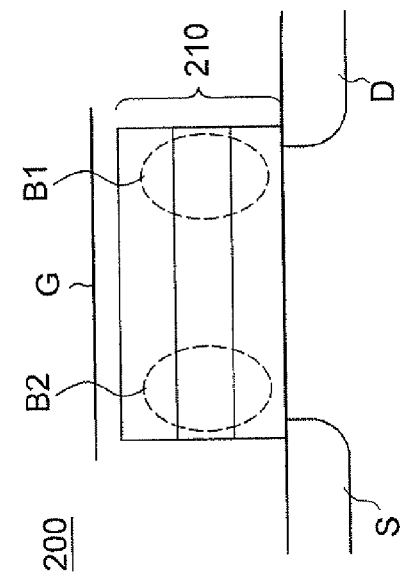
Figure 2B:
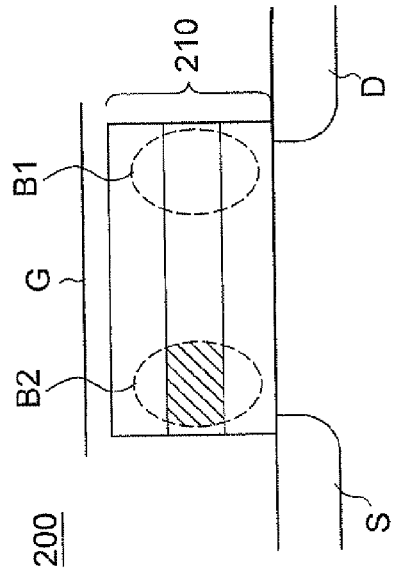
Figure 2E:
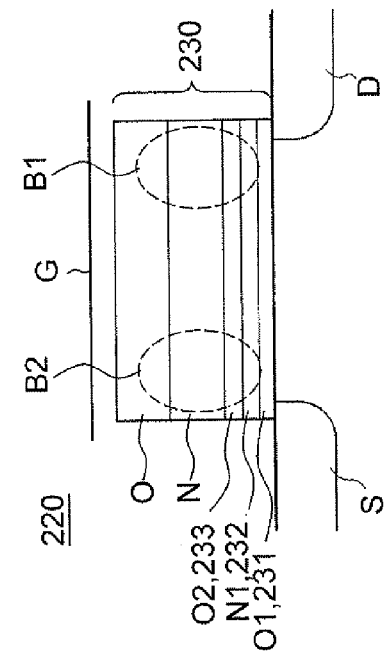
FIGS. 2E~2H illustrate four kinds of bit states of the BE-SONOS memory cell.
Figure 2F:
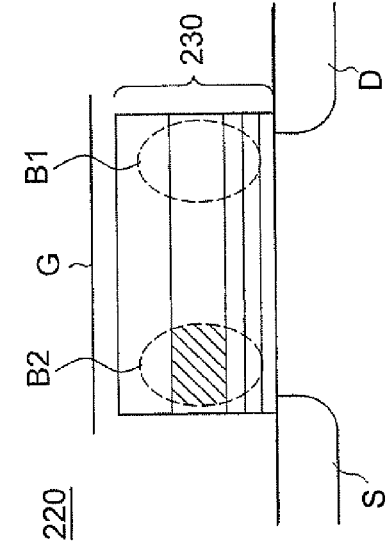
Figure 2G:
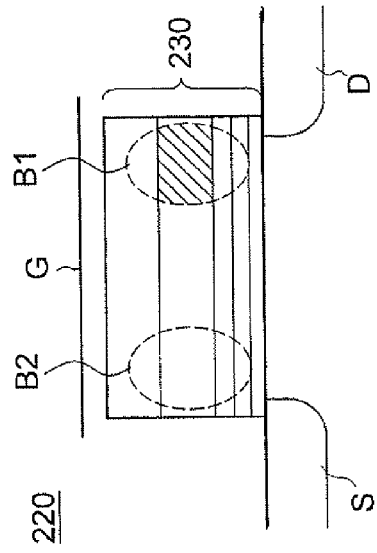
Figure 2H:
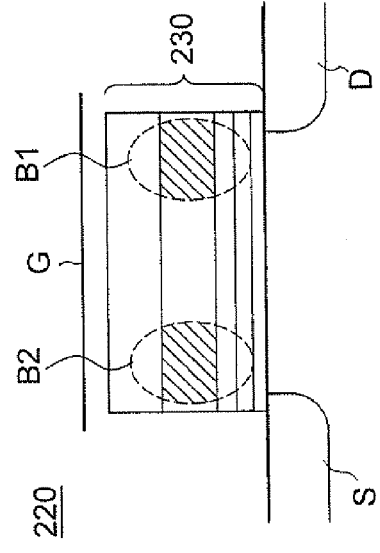

The bit states of the first bit storage node B1 and the second bit storage node B2 in FIG. 2A are logic "1" and "1" respectively. The bit states of the first bit storage node B1 and the second bit storage node B2 in FIG. 2B are logic "1" and "0" respectively. The bit states of the first bit storage node B1 and the second bit storage node B2 in FIG. 2C are logic "0" and "1" respectively. The bit states of the first bit storage node B1 and the second bit storage node B2 in FIG. 2D are logic "0" and "0" respectively. The slash area represents electrons captured in the ONO structure 210, and the corresponding bit storage node is programmed as logic "0."

Figure 3:
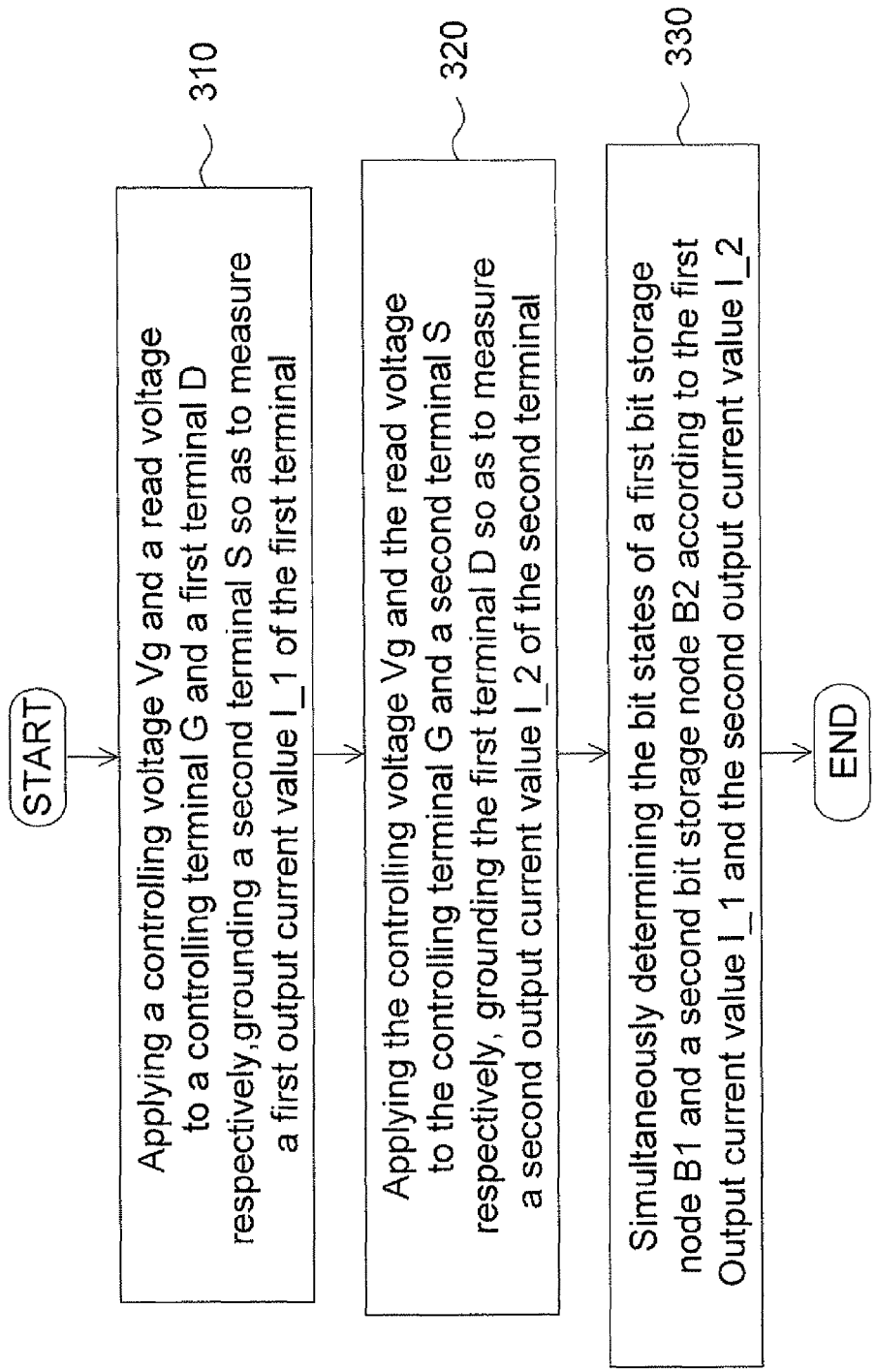
FIG. 3 is a flow chart of a method of reading a dual-bit memory cell 200 according to the present invention.

FIG. 3 is a flow chart of a method of reading a dual-bit memory cell 200 according to the present invention. Please refer to FIG. 3. The method of the present invention is for respectively reading the first terminal D and the second terminal S of the dual-bit memory cell 200 and simultaneously determining the bit states of the dual-bit memory cell 200 according to output current values.

First, in a step 310, a controlling voltage Vg and a read voltage Vr are applied to the controlling terminal G and the first terminal D respectively. Meanwhile, the second terminal S is grounded so as to measure a first output current value I_1 of the first terminal D. Next, in a step 320, the controlling voltage Vg and the read voltage Vr are applied to the controlling terminal G and the second terminal S respectively. Also, the first terminal D is grounded so as to measure a second output current value I_2 of the second terminal S. Then, in a step 330, the bit state of the first bit storage node B1 and the second bit storage node B2 are determined simultaneously according to the first output current value I_1 and the second output current value I_2.

The detailed determining method in the step 330 is illustrated as follow with reference to the accompany drawings. However, the present invention is not limited thereto.

Figure 4E:
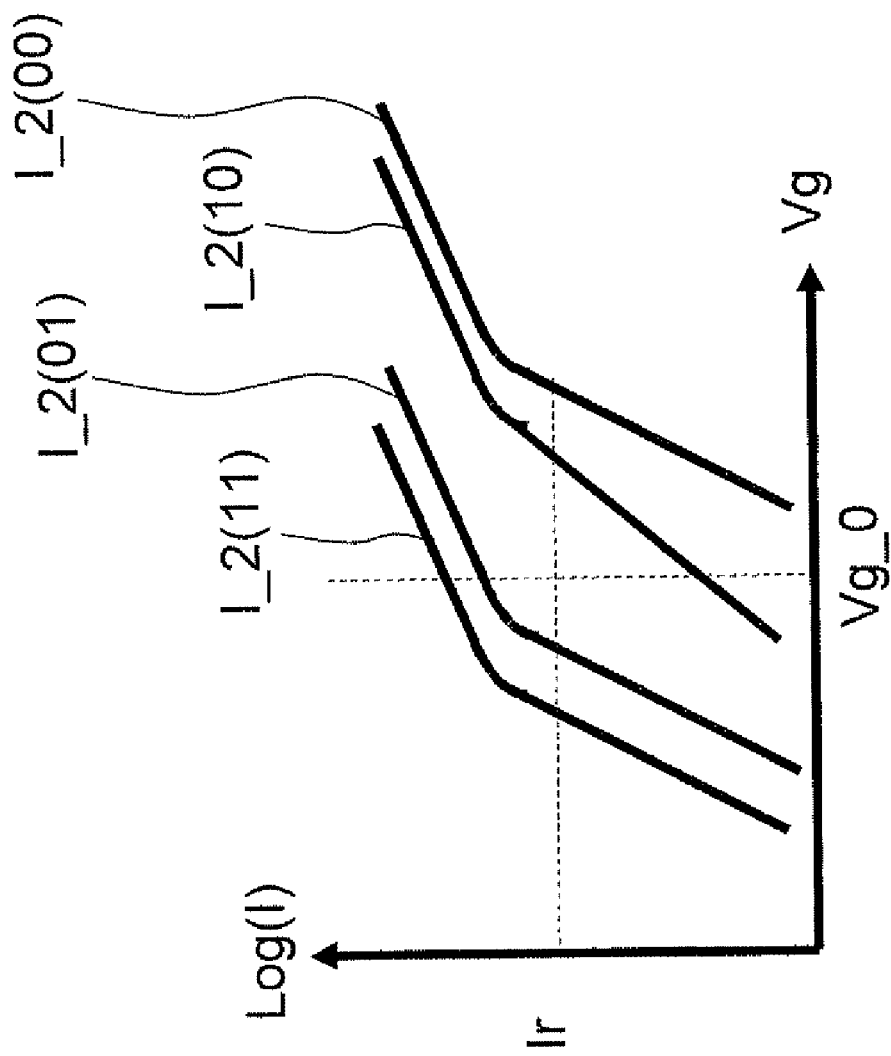
FIG. 4E shows the second output current value I_2 in FIGS. 4A~4D changing according to the controlling voltage Vg.

Please refer to FIGS. 4A~4E. FIGS. 4A~4D illustrate the first output current value I_1 and the second output current value I_2 changing according to the controlling voltage Vg in the four kinds of bit states (as shown in FIGS. 2A~2D) of the dual-bit memory cell 200. FIG. 4E shows the second output current value I_2 in FIGS. 4A~4D changing according to the controlling voltage Vg. For example, in the step 310 and the step 320, the read voltage Vr is 1.5V and the controlling voltage Vg is 3V. The corresponding change of the first output current value I_1 and the second output current value I_2 are measured. For clarity, the vertical axes in FIGS. 4A~4E represent logarithmic values of the output current values I.

Because the bit states of the first bit storage node B1 and the second bit storage node B2 are symmetric in FIGS. 2A and 2D, the first output current value I_1 and the second output current value I_2 in FIGS. 4A and 4D are substantially the same. However, due to the change of the threshold voltage caused by the programming operation, the first output current value I_1 and the second output current value I_2 in FIG. 4D are shifted. FIGS. 4B~4C are corresponding to FIGS. 2B~2C. Only one bit storage node is programmed. Therefore, only one of the first output current value I_1 and the second output current value I_2 is shifted.

Moreover, FIG. 4E illustrates the second output current value I_2 in FIGS. 4A~4D changing according to the controlling voltage Vg. I_2(11), I_2(01), I_2(10) and I_2(00) represent the second output current values I_2 in FIGS. 4A~4D respectively. I_2(11) and I_2(00) are referred to the first output current values I_1 in FIGS. 4A and 4D respectively. I_2(01) and I_2(10) are referred to the first output current value I_1 in FIGS. 4C and 4B respectively. The curve I_2(01) corresponding to FIG. 4B and the curve I_2(11) corresponding to FIG. 4A are different due to the second-bit effect. Also, the curve I_2(10) corresponding to FIG. 4C and the curve I_2(00) corresponding to FIG. 4D are different due to the second-bit effect. For example, the first bit storage node B1 is read through conventional reverse read. In other words, when the bit state of "1" or "0" is read by comparing the second output current value I_2 and a reference current value Ir under a controlling voltage Vg_0, log(Ir) is located within the range between the vertical axis values corresponding to the curve I_2(01) and the curve I_2(10), as shown in FIG. 4E. Accordingly, the bit state of the first bit storage node B1 is determined correctly under the second-bit effect.

In the present invention, the bit states of the first bit storage node B1 and the second bit storage node B2 are determined simultaneously in the step 330 according to the relation between the first output current value I_1 and the second output current value I_2 in FIGS. 4A~4D. In conventional reverse read scheme, the difference between I_2(01) and I_2(10) should be large enough so that there exist a suitable Ir to tell the state of B1 correctly at any time. By present invention, such large difference between I_2(01) and I_2(10) is no more necessary and the sensing window will be larger. Following embodiments are illustrated as examples.

First Embodiment

Figure 5:
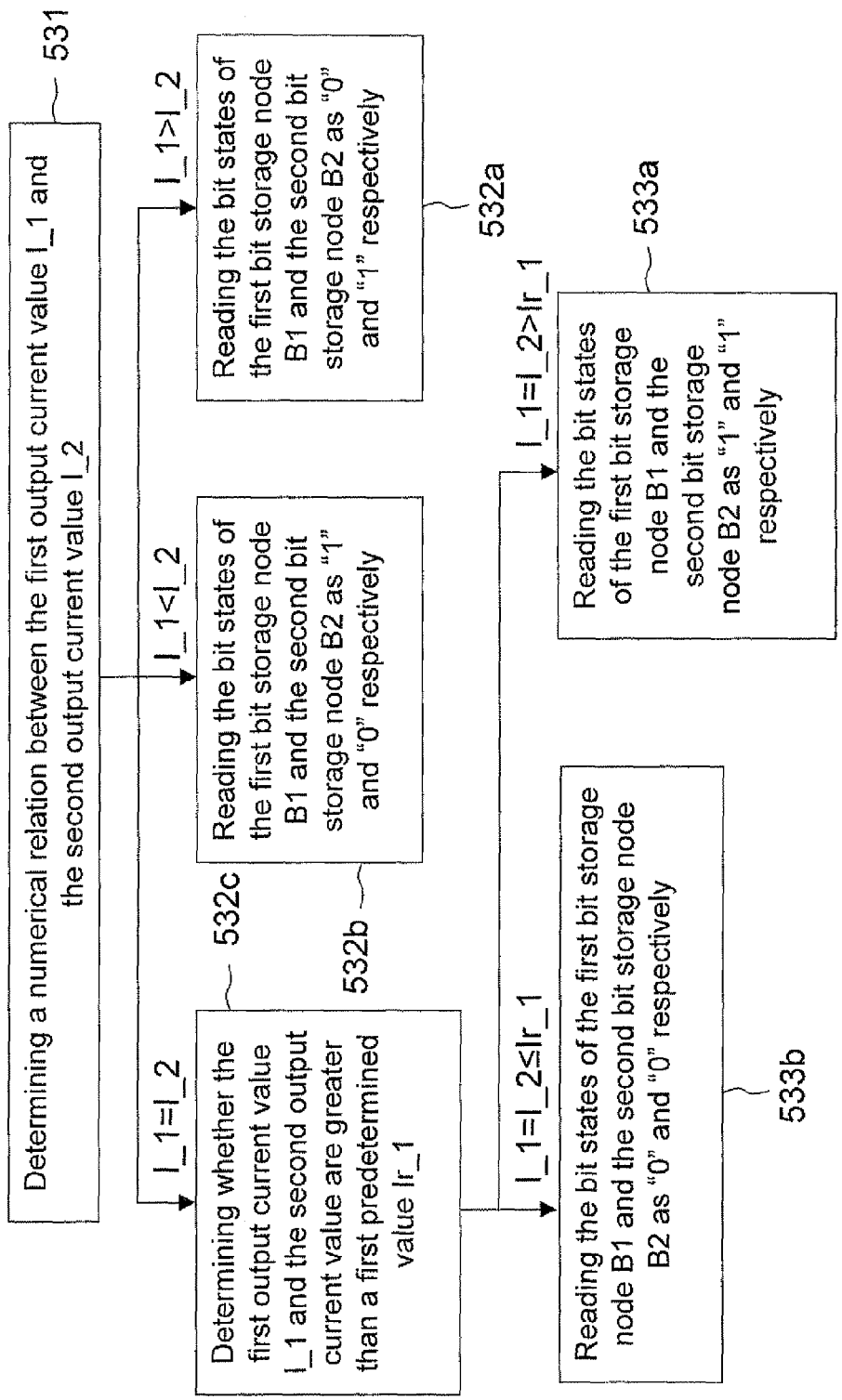
FIG. 5 is a flow chart of sub-steps of a step 330 in FIG. 3 according to a first embodiment of the present invention.

Please referring to FIG. 5, a flow chart of sub-steps of the step 330 in FIG. 3 according to a first embodiment of the present invention is shown in FIG. 5. Take the first output current value I_1 and the second output current value I_2 under the controlling voltage Vg_0 in FIG. 4E for example. First, in a step 531, the numerical relation between the first output current value I_1 and the second output current value I_2 is determined. There are three kinds of numerical relations, that is, I_1>I_2, I_1<I_2 or I_1=I_2.

As shown in FIG. 5, when the first output current value I_1 is greater than the second output current value I_2, the method goes to a step 532a. The bit states of the first bit storage node B1 and the second bit storage node B2 are read as "0" and "1" respectively. When the first output current value I_1 is less than the second output current value I_2, the method goes to a step 532b. The bit states of the first bit storage node B1 and the second bit storage node B2 are read as "1" and "0" respectively.

Furthermore, when the first output current value I_1 is substantially equal to the second output current value I_2, the method goes to a step 532c. It is determined whether the first output current value I_1 and the second output current value I_2 are greater than a first predetermined value Ir_1. When I_1 is equal to I_2 and greater than Ir_1, the method goes to a step 533a. The bit states of the first bit storage node B1 and the second bit storage node B2 are read as "1" and "1" respectively. When I_1 is equal to I_2 but not greater than Ir_1, the method goes to a step 533b. The bit states of the first bit storage node B1 and the second bit storage node B2 are read as "0" and "0" respectively.

As stated above, after it is determined whether I_1 is greater than I_2, the bit states of the first bit storage node B1 and the second bit storage node B2 are determined simultaneously. When I_1 is equal to I_2, a reference current value is used to determine the relation between the curve I_2(11) and the curve I_2(00) in FIG. 4E. Because the possibility of I_2(01) and I2(10) is excluded, the range of the reference current value is extended to the range between I_2(11) and I_2(00) from the range between I_2(01) and I_2(10). For example, Ir_1 is set so that log(Ir_1) is located within the range between the vertical axis values corresponding to I_2(11) and I_2(00). Furthermore, Ir_1 can be decided as close as I_2(00) because the "00" state is automatically decided when the condition I_1=I_2>Ir_1 doesn't exist. It is not necessary to judge whether I_1=I_2<Ir_1. As a result, the sensing window is increased.

The determining order of the bit state of "1" and "1" and the bit state of "0" and "0" can be changed according to the demand or other factors.

Second Embodiment

Figure 6:
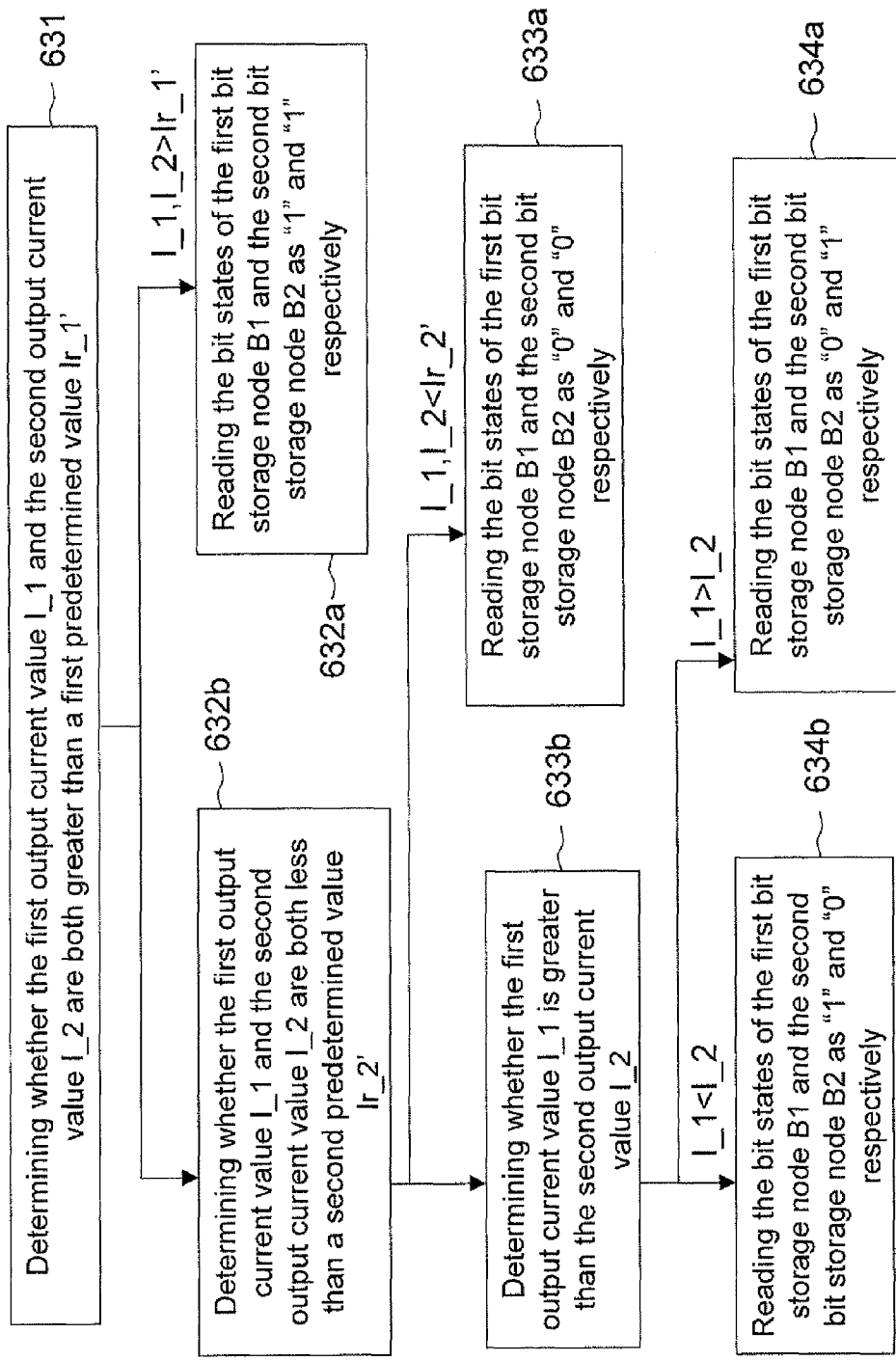
FIG. 6 is a flow chart of sub-steps of the step 330 in FIG. 3 according to a second embodiment of the present invention.

Please referring to FIG. 6, a flow chart of sub-steps of the step 330 in FIG. 3 according to a second embodiment of the present invention is illustrated in FIG. 6. Take the first output current value I_1 and the second output current value I_2 under the controlling voltage Vg_0 in FIG. 4E for example. First, in a step 631, it is determined whether the first output current value I_1 and the second output current I_2 are both greater than the first predetermined value Ir_1', which should be as close as I_2(10), but is not lower than I_2(10). If yes, the method goes to a step 632a, the bit states of the first bit storage node B1 and the second bit storage bode B2 are read as "1" and "1" respectively.

As shown in FIG. 6, when not both the first output current value I_1 and the second output current value I_2 are greater than Ir_1', the method goes to a step 632b. It is determined whether the first output current value I_1 and the second output current value I_2 are both less than a second predetermined value Ir_2', which can be as close as I_2(01), but is not higher than I_2(01). If yes, the method goes to a step 633a. The bit states of the first bit storage node B1 and the second bit storage bode B2 are read as "0" and "0" respectively.

Moreover, when the first output current value I_1 and the second output current value I_2 are not both less than Ir_2', the method goes to a step 633b. It is determined whether the first output current value I_1 is greater than the second output current value I_2. If yes, the method goes to a step 634a. The bit states of the first bit storage node B1 and the second bit storage node B2 are read as "0" and "1" respectively. If no, the method goes to a step 634b. The bit states of the first bit storage node B1 and the second bit storage node B2 are read as "1" and "0" respectively.

As stated above, the difference between the first embodiment and the second embodiment is that the bit states of "1" and "1" and the bit states of "0" and "0" are determined first. Take the step 631 for example. At least one of the bit storage nodes is programmed except when the bit state is "1" and "1." In other words, at least one of the curve I_1 and the curve I_2 is shifted so as to determine whether the bit states are "1" and "1" first. Afterward, it is determined whether the bit states are "0" and "0" according to the shifting phenomenon. When the bit states are neither "1" and "1" nor "0" and "0", it is determined whether the bit states are "0" and "1" or "1" and "0" according to the numerical relation between I_1 and I_2.

What is worth mentioning is that Ir_1' has to be located within the range between the curves I_2(10) and I_2(11), and Ir_2' has to be located within the range between the curves I_2(01) and I_2(00). As a result, the relation can be determined correctly in the step 631 and the step 632b. The determining order of the bit states of "1" and "1" and the bit state "0" and "0" can be changed according to the demand or other factors. For example, in the step 631, it is determined whether the bit states are "0" and "0" according to Ir_2' first. Then, it is determined whether the bit states are "1" and "1" according to Ir_1'.

However, anyone who has ordinary skill in the field of the present invention can understand that the present invention is not limited thereto. For example, the output values in the bit state in FIG. 4A or 4D may not be symmetric. In other words, a small deviation may occur between I_1 and I_2 in FIG. 4A practically. In the step 531 in FIG. 5, a flexible range is set to allow difference between I_1 and I_2, and it is still determined that I_1 is equal to I_2 within the range. The first predetermined value and the second predetermined value in the first and second embodiments can be adjusted slightly. As long as the bit states of the bit storage nodes are determined simultaneously according to the output current values in two reading directions, the present invention encompasses such modification.

In the method of reading a dual-bit memory call according to the above embodiments of the present invention, the bit states stored by the memory call are determined simultaneously according to the numerical relations among the output current values and the predetermined reference value. Accordingly, the bit states of the dual-bit memory cell are determined more correctly, and the sensing window is increased effectively.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of reading a dual-bit memory cell, the dual-bit memory cell comprising a first bit storage node and a second bit storage node adjacent to a first terminal and a second terminal respectively, the method comprising:
   (a) measuring a first output current value of the first terminal;
   (b) measuring a second output current value of the second terminal; and
   (c) directly comparing the first output current value and the second output current value and determining bit states of the first bit storage node and the second bit storage node according to whether the first output current value is greater than, less than or substantially equal to the second output current value.

2. The method according to claim 1, wherein
   the dual-bit memory cell is a nitride trapping layer memory cell; and
   the dual-bit memory cell comprises a charge-trapping structure and an insulating structure adjacent thereto.

3. The method according to claim 2, wherein the insulating structure comprising an oxide layer less than 2 nm in thickness.

4. The method according to claim 2, wherein the insulating structure comprising an oxide layer of a thickness between 0.5 nm to 2 nm.

5. The method according to claim 2, wherein the insulating structure comprising an oxide layer less than 1.5 nm in thickness.

6. The method according to claim 2, wherein the insulating structure comprising a nitride layer less than 2 nm in thickness.

7. The method according to claim 2, wherein the insulating structure comprising a nitride layer of a thickness between 1 nm to 2 nm.

8. The method according to claim 1, wherein the step (c) further comprises:
   reading the bit states of the first bit storage node and the second bit storage node as "0" and "1" respectively when the first output current value is greater than the second output current value; and reading the bit states of the first bit storage node and the second bit storage node as "1" and "0" respectively when the first output current value is less than the second output current value.

9. The method according to claim 1, wherein the step (c) further comprises:
    determining whether the first output current value and the second output current value are greater than a first predetermined value when the first output current value is substantially equal to the second output current value; if yes, reading the bit states of the first bit storage node and the second bit storage node as "1" and "1" respectively.

10. The method according to claim 1, wherein the step (c) further comprises:
    reading the bit states of the first bit storage node and the second bit storage node as "0" and "0" respectively when neither the first output current value nor the second output current value is greater than a first predetermined value.

11. The method according to claim 1, wherein the step (c) further comprises:
    determining whether the first output current value and the second output current value are both greater than a first predetermined value; if yes, reading the bit states of the first bit storage node and the second bit storage node as "1" and "1" respectively.

12. The method according to claim 11, wherein the step (c) further comprises:
    determining whether the first output current value and the second output current value are both less than a second predetermined value when not both the first output current value and the second output current value are greater than the first predetermined value; if yes, reading the bit states of the first bit storage node and the second bit storage node as "0" and "0" respectively.

13. The method according to claim 12, wherein the step (c) further comprises:
    determining whether the first output current value is greater than the second output current value when not both the first output current value and the second output current value are less than the second predetermined value; if yes, reading the bit state of the first bit storage node and the second bit storage node as "0" and "1" respectively; if not, reading the bit states of the first bit storage node and the second bit storage node as "1" and "0" respectively.

14. A method of reading a multi-bit memory cell, the multi-bit memory cell comprising a first bit storage node and a second bit storage adjacent to a first terminal and a second terminal respectively, the method comprising:
    (a) measuring a first output current value of the first terminal;
    (b) measuring a second output current value of the second terminal; and
    (c) referring the first output current value and the second output current value and determining bit states of the first bit storage node and the second bit storage node.

15. The method according to claim 14, wherein
    the dual-bit memory cell is a nitride trapping layer memory cell; and
    the dual-bit memory cell comprises a charge-trapping structure and an insulating structure adjacent thereto.

16. The method according to claim 14, wherein the step (c) comprises:
    determining the numerical relation between the first output current value and the second output current value.

17. The method according to claim 14, wherein the step (c) further comprises:
    reading the bit states of the first bit storage node and the second bit storage node as "0" and "1" respectively when the first output current value is greater than the second output current value; and
    reading the bit states of the first bit storage node and the second bit storage node as "1" and "0" respectively when the first output current value is less than the second output current value.

18. The method according to claim 14, wherein the step (c) further comprises:
    determining whether the first output current value and the second output current value are greater than a first predetermined value when the first output current value is substantially equal to the second output current value; if yes, reading the bit states of the first bit storage node and the second bit storage node as "1" and "1" respectively.

19. The method according to claim 14, wherein the step (c) further comprises:
    reading the bit states of the first bit storage node and the second bit storage node as "0" and "0" respectively when neither the first output current value nor the second output current value is greater than a first predetermined value.

20. The method according to claim 14, wherein the step (c) further comprises:
    determining whether the first output current value and the second output current value are both greater than a first predetermined value; if yes, reading the bit states of the first bit storage node and the second bit storage node as "1" and "1" respectively.

21. The method according to claim 20, wherein the step (c) further comprises:
    determining whether the first output current value and the second output current value are both less than a second predetermined value when not both the first output current value and the second output current value are greater than the first predetermined value; if yes, reading the bit states of the first bit storage node and the second bit storage node as "0" and "0" respectively.

22. The method according to claim 21, wherein the step (c) further comprises:
    determining whether the first output current value is greater than the second output current value when not both the first output current value and the second output current value are less than the second predetermined value; if yes, reading the bit state of the first bit storage node and the second bit storage node as "0" and "1" respectively; if not, reading the bit states of the first bit storage node and the second bit storage node as "1" and "0" respectively.

* * * * *